(12) United States Patent
Yang

(10) Patent No.: US 7,652,284 B2
(45) Date of Patent: Jan. 26, 2010

(54) PROCESS MONITOR MARK AND THE METHOD FOR USING THE SAME

(75) Inventor: Chin-Cheng Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 623 days.

(21) Appl. No.: 11/340,910

(22) Filed: Jan. 27, 2006

(65) Prior Publication Data

US 2007/0178659 A1     Aug. 2, 2007

(51) Int. Cl.
    *G03F 9/00*     (2006.01)
    *H01L 23/58*     (2006.01)
(52) U.S. Cl. .............................. 257/48; 257/797; 430/5; 430/22; 430/30
(58) Field of Classification Search .................. 257/48, 257/797; 430/5, 22, 30
See application file for complete search history.

(56) References Cited

U.S. PATENT DOCUMENTS 6,620,557 B1 *   9/2003   Hosono et al. ................. 430/5
7,175,943 B2 *   2/2007   Asano et al. ................... 430/5

* cited by examiner

*Primary Examiner*—Christopher G Young
(74) *Attorney, Agent, or Firm*—J.C. Patents

(57) ABSTRACT

The invention is directed to a mark pattern for forming a process monitor mark in a patterned underlayer to monitor a patterning result of a photoresist layer over the patterned underlayer around the boundary between a peripheral region and a device region of a die, wherein the patterned underlayer is formed by using a first mask having a first pattern in a main region of the first mask and the mark pattern at an unused region of the first mask and the first pattern possesses a first mask critical dimension. The mark pattern comprising: a second pattern and a frame pattern. The second pattern has a second mask critical dimension, wherein the second mask critical dimension is as same as the first mask critical dimension. The frame pattern encloses the second pattern.

13 Claims, 6 Drawing Sheets

PROCESS MONITOR MARK AND THE METHOD FOR USING THE SAME

BACKGROUND OF THE INVENTION

1. Field of Invention

The present invention relates to a mark and a method for using the same. More particularly, the present invention relates to a process monitor mark and a method for using the same.

2. Description of Related Art

Conventionally, as the numbers of the material layers formed over the substrate is increased, the surface of the topmost material layer over the peripheral region of the substrate is relatively smoother. However, in the process for patterning the topmost material layer, it is not easy to control the exposure process of the lithography process performed on the photoresist layer used for patterning the topmost material layer to have the margin of the pattern topmost material layer at a desirable position around the boundary between the peripheral region and the device region. Typically, after the topmost material layer is etched by using the patterned photoresist layer as a mask, the margin of the patterned topmost material layer is inspected (After Etching Inspection, AEI) and determined whether the margin of the patterned topmost material shifts. By referring the inspection result, in the next process run, the users adjust the exposure factors of the lithography process performed on the photoresist layer or re-align the mask while the margin of the patterned topmost material layer shifts away.

FIG. 1 is a cross-sectional view schematically illustrating a patterned topmost material layer after etching process according to the conventional process. As shown in FIG. 1A, when the pattern photoresist (not shown) shifts towards to the peripheral region 100b of the substrate 100, the margin of the patterned topmost material layer 106 is in the peripheral region 100b and is far away from the boundary between the peripheral region 100b and the device region 100a. Therefore, a large amount of the underlayer structure 104 is covered by the patterned topmost material layer 106 in the peripheral region 100b after the etching process is performed, wherein the underlayer structure 104 comprises an upper layer 104b and a lower layer 104a. Because the underlayer structure 104 in the peripheral region 100b is overly covered by the patterned topmost material layer 106, the quality of the later performed process for lifting the patterned topmost material layer 106 through the removal of upper layer 104b is poor. That is, the large amount of the topmost material layer 106 in the peripheral region 100b forbids the removal process of the upper layer 104b so that most of the topmost material layer 106 and the upper layer 104b still remain over the substrate 100 in the peripheral region 100b even after the lifting process is performed (as shown in FIG. 1B). Under the situation mentioned above, the product is regarded as failure.

FIG. 2 is a cross-sectional view schematically illustrating a patterned topmost material layer after etching process according to the conventional process. As shown in FIG. 2, when the pattern photoresist (not shown) draws back to the device region 200a of the substrate 200, the margin of the patterned topmost material layer 206 is in the peripheral region 200b and is very close to the device region 200a or even right inside the device region 200a. Therefore, the isolation structure 201 in the substrate 200 at the boundary between the peripheral region 200b and the device region 200a is easily damaged during the topmost material layer 206 is patterned. Hence, the pinhole 210 is formed in the isolation structure 201. Under the situation mentioned above, the product can no longer be used and is regarded as failure.

Since there is no way to pre-inspect the margin of the topmost material layer before it is etched, the patterned topmost material layer should be removed and reworked when the margin of the patterned topmost material layer is not at the desirable position around the boundary of the device region and the peripheral region. Therefore, the cost is increased due to the rework. Furthermore, the whole device is failure since the isolation structure is damaged during the etching process is performed on the topmost material layer.

SUMMARY OF THE INVENTION

Accordingly, at least one objective of the present invention is to provide a mark pattern for forming a process monitor mark capable for monitoring the margin of the top material layer to be aligned in a specific region in the peripheral region of a die.

At least another objective of the present invention is to provide a method for patterning a material layer with the use of a process monitor mark so that the margin of the material layer after patterning process around the boundary between the device region and the peripheral region of the die can be well control. Hence, the problems caused by the margin of the patterned material layer shifting toward to the peripheral region and drawing back to the device region can be solved.

To achieve these and other advantages and in accordance with the purpose of the invention, as embodied and broadly described herein, the invention provides a mark pattern for forming a process monitor mark in a patterned underlayer to monitor a patterning result of a photoresist layer over the patterned underlayer around the boundary between a peripheral region and a device region of a die, wherein the patterned underlayer is formed by using a first mask having a first pattern in a main region of the first mask and the mark pattern at an unused region of the first mask and the first pattern possesses a first mask critical dimension. The mark pattern comprising: a second pattern and a frame pattern. The second pattern has a second mask critical dimension, wherein the second mask critical dimension is as same as the first mask critical dimension. The frame pattern encloses the second pattern.

In the present invention, the photoresist layer is formed by using a second mask with a third pattern at an unused region of the second mask corresponding to the unused region of the first mask. The second mask further comprises a fourth pattern in a main region of the second mask corresponding to the main region of the first mask. The third pattern is smaller than the second patterns but smaller than an area enclosed by the frame pattern. A line width of the second pattern are as same as a line width of the first pattern. A space width of the second pattern are as same as a space width of the first pattern. The unused region of the first mask includes a region corresponding to a scribe line region of a die. The unused region of the second mask includes a region corresponding to a scribe line region of a die.

The present invention also provides a process monitor mark for monitoring a patterning result of a photoresist layer over a patterned underlayer around the boundary between a peripheral region and a device region of a die, wherein the process monitor mark and a first pattern having a first critical dimension are simultaneously formed in the patterned underlayer at an unused region and the device region of the die respectively. The process monitor mark comprises a first mark and a frame mark. The first mark has a second critical dimension, wherein the second critical dimension is as same as the first critical dimension. The frame mark encloses the second pattern.

In the present invention, the photoresist layer possesses a second pattern at the device region and a second mark at the unused region. The second mark covers the first mark and is enclosed by the frame mark. The second mark is larger than the first mark but is smaller than an area enclosed by the frame mark. A line width of the first mark are as same as a line width of the first pattern. A space width of the first mark are as same as a space width of the first pattern. The unused region of the die includes a scribe line region. For a material layer on the patterned underlayer and below the photoresist layer, the width of the frame mark is about 2.2-3 times of the thickness of the material layer.

The present invention further provides a method for patterning a material layer over a wafer, wherein the material layer is formed on a patterned underlayer, the patterned underlayer possesses a first pattern and a process monitor mark at a device region and an unused region of the wafer respectively and the process monitor mark comprises a first mark and a frame mark enclosing the first mark. The method comprises steps of forming a first photoresist layer having a second pattern and a second mark on the material layer, wherein the second pattern is at the device region and the second mark covers the first mark located at the unused region. A distance between a margin of the second mark and the frame mark is measured. The first photoresist layer is removed when the distance is not within a tolerance range. The material layer is patterned by using the first photoresist layer when the distance is within the tolerance range.

In the present invention, the second mark is larger than the first mark but smaller than an area enclosed by the frame mark. A critical dimension of the first pattern is as same as that of the first mark. A line width of the first mark are as same as a line width of the first pattern. A space width of the first mark are as same as a space width of the first pattern. The unused region includes a scribe line region. The width of the frame mark is about 2.2-3 times of the thickness of the material layer.

The present invention provides a method for monitoring a patterning process of a photoresist layer over a patterned underlayer around the boundary between a peripheral region and a device region of a die, wherein the patterned underlayer has a first pattern and a first mark in the device region and an unused region of the die respectively. The method comprises steps of forming a photoresist layer over the underlayer and then exposing the photoresist to form a second pattern and a second mark at the device region and the unused region in the photoresist layer respectively. The photoresist is developed and a distance between a margin of the second mark and the frame mark is measured. The first photoresist layer is removed when the distance is not within a tolerance range.

In the present invention, the second mark is larger than the first mark but smaller than an area enclosed by the frame mark. A critical dimension of the first pattern is as same as that of the first mark. A line width of the first mark are as same as a line width of the first pattern. A space width of the first mark are as same as a space width of the first pattern. The unused region includes a scribe line region. The width of the frame mark is about 2.2-3 times of the thickness of the material layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
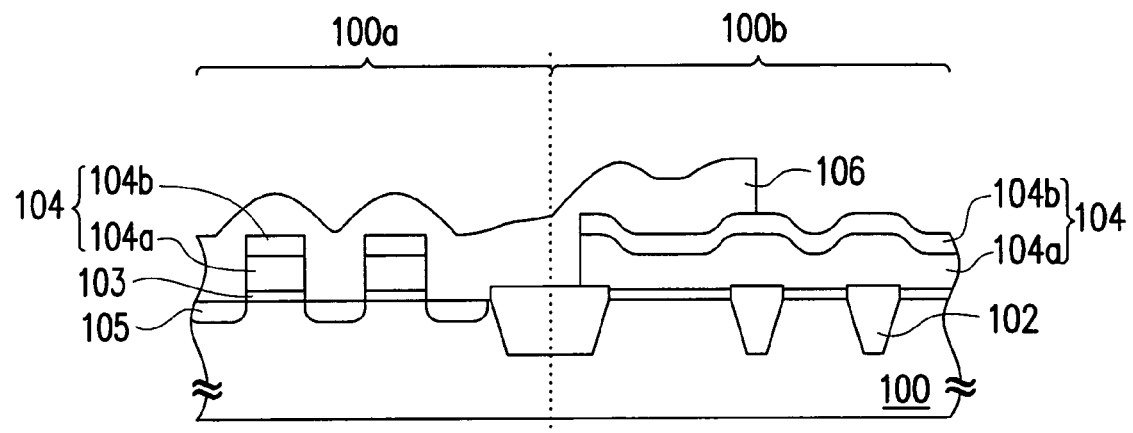
FIG. 1A is a cross-sectional view schematically illustrating a patterned topmost material layer after etching process according to the conventional process.
Figure 1B:
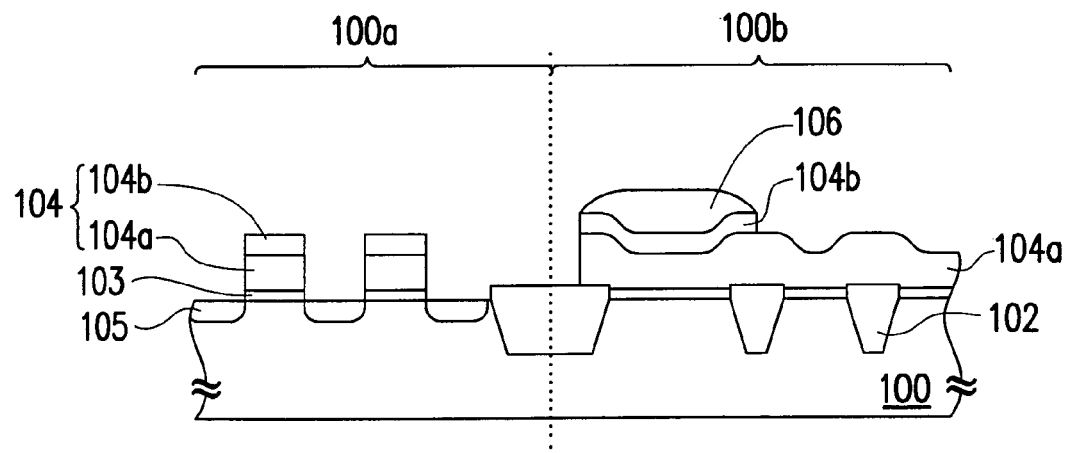
FIG. 1B is a cross-sectional view schematically illustrating the unwanted material remaining over the substrate in the peripheral region according to the conventional process.
Figure 2:
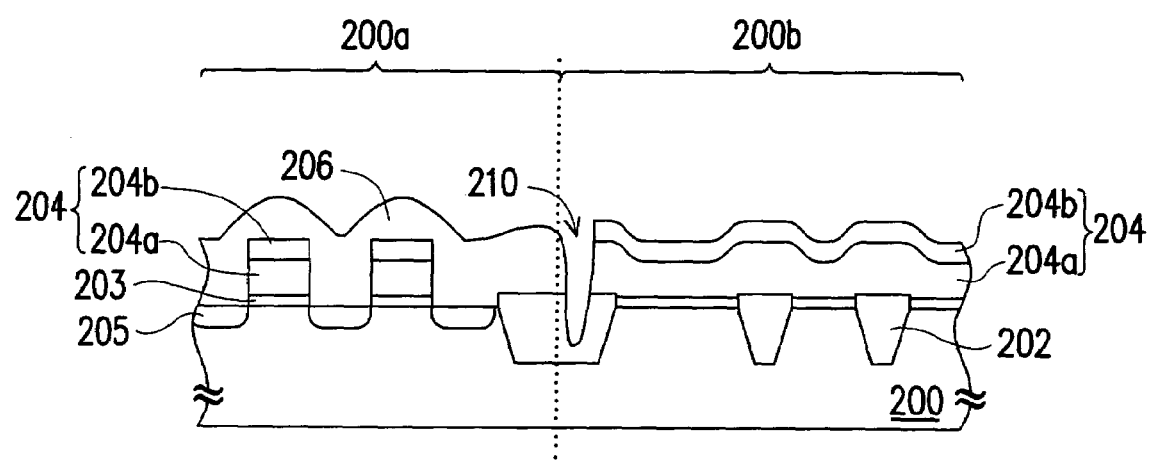
FIG. 2 is a cross-sectional view schematically illustrating a patterned topmost material layer after etching process according to the conventional process.
Figure 3A:
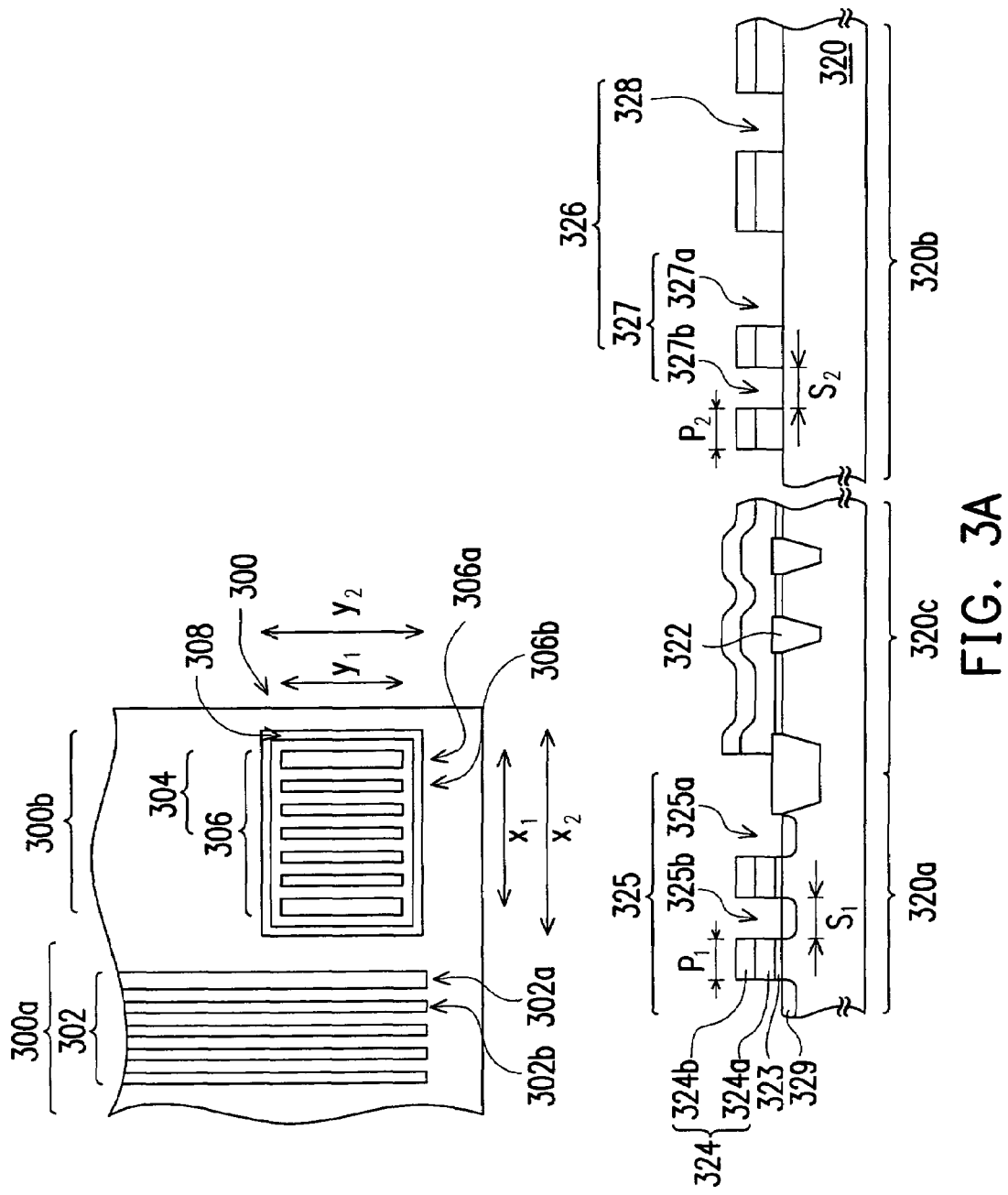
FIGS. 3A through 3C are cross-sectional views showing a method for monitoring a development process according to a preferred embodiment of the invention.
Figure 3B:
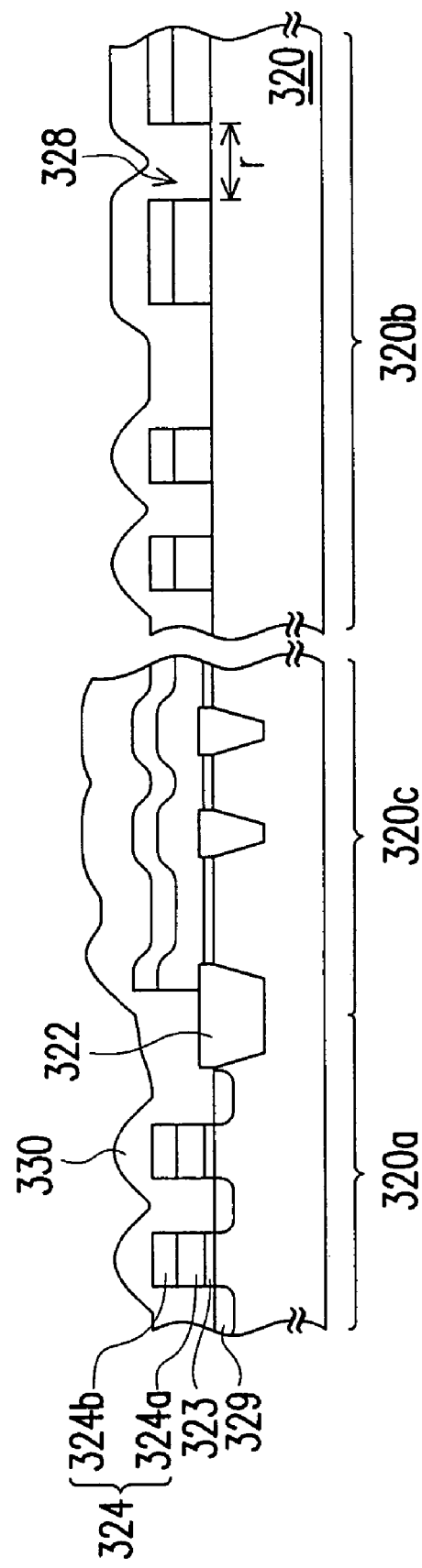
Figure 3C:
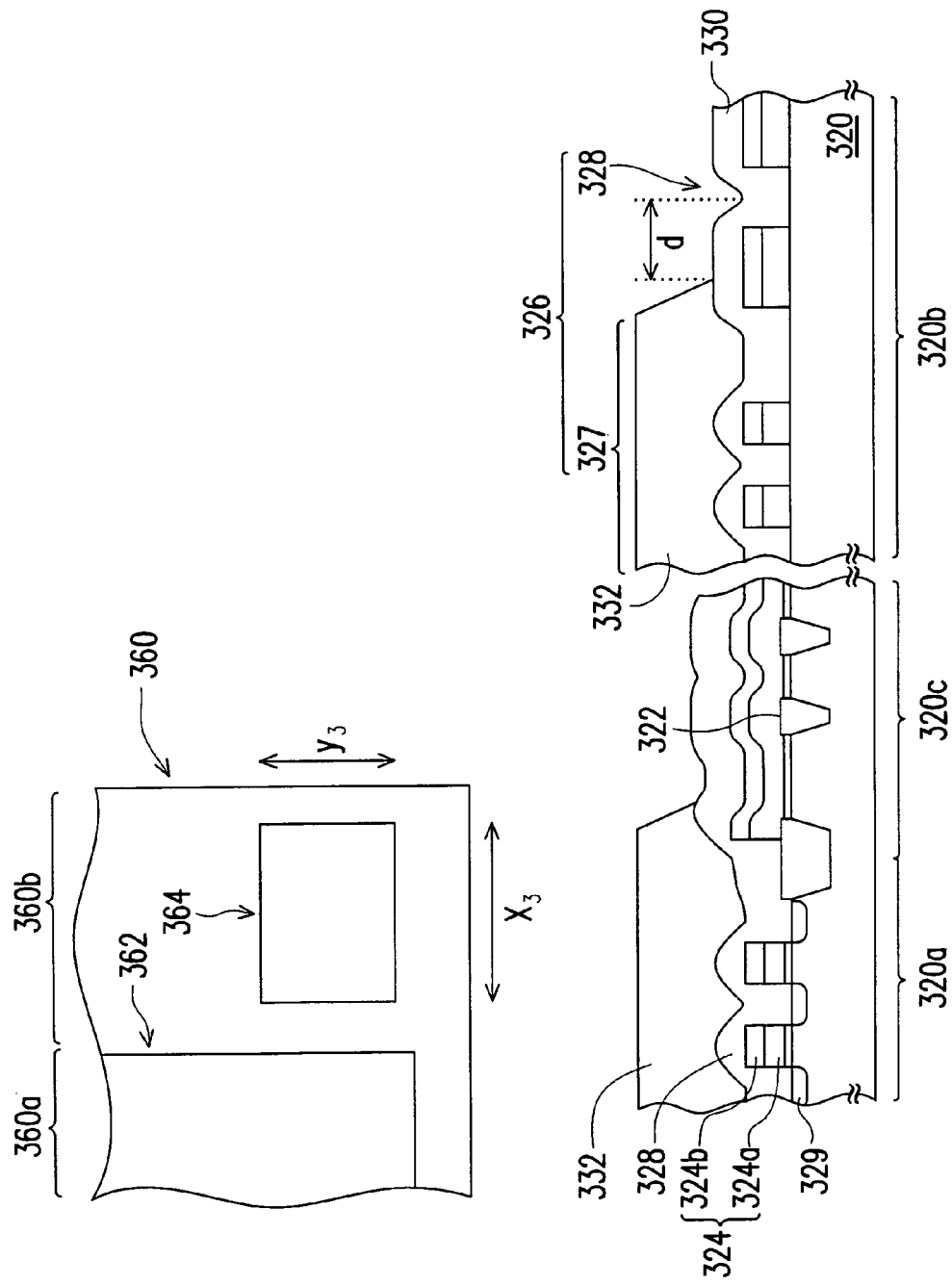

FIGS. 3A through 3C are cross-sectional views showing a method for monitoring a development process according to a preferred embodiment of the invention. As shown in FIG. 3A, a substrate 320 is provided. The substrate 320 possesses several dies. Each die can be divided into a device region 320a, an unused region 320b and a peripheral region 320c, which is adjacent to the device region 320a. The unused region 320b can be within the device region 320a without having any device formed thereon. Preferably, the unused region 320b can be, for example, a scribe line region around the die. Furthermore, several isolation structures 322 are formed in the device region 320a and the peripheral region 320c. The isolation structure 322 can be, for example, a shallow trench isolation.

Then, an underlayer (not shown) is formed over the substrate 320. The underlayer can be a combination layer comprising a conductive layer and a dielectric layer on the conductive layer. The conductive layer can be, for example, formed from the polysilicon and the dielectric layer can be, for example, formed from the silicon nitride. Furthermore, in the device region, a combination layer (not shown) is located between the substrate 320 and the underlayer. The combination layer can be, for example, a silicon oxide-silicon nitride-silicon oxide layer.

The underlayer and the combination layer are defined to form a patterned underlayer structure 324 and a combination layer 323 by using a mask 300 having a main pattern 302 and a mark pattern 304 in a main region 300a and an unused region 300b of the mask 300 respectively. In the device region 320a, the conductive layer 324a of the patterned underlayer structure 324 and the combination layer 323 together form a gate structure. In the preferred embodiment of the present invention, the array patterns on the mask 300 is used as an example for simplifying the description of the present invention. However, the patterns on the mask 300 is not limited to be the array patterns. That is, the patterns on the mask 300 can be varied according to the process to be performed. It should be noticed that the unused region 300b of the mask 300 is corresponding to the unused region 320b of the substrate 320. Moreover, the mark pattern 304 comprises a pattern 306 and a frame pattern 308. More specifically, the frame pattern 308 encloses the pattern 306. Furthermore, the size of the pattern 306 is smaller than the area enclosed by the frame pattern 308. That is, the length y1 and the width x1 of the pattern 306 are smaller than the length y2 and the width x2 of the frame pattern 308.

Moreover, during the formation of the patterned underlayer structure 324, the main pattern 302 and the mark pattern 304 on the mask 300 are transported into the pattern underlayer structure 324 to be a pattern 325 and a process monitor mark 326 at the device region 320a and the unused region 320b respectively. That is, for the main pattern 302 on the mask 300, the sub-pattern 302a and the sub-pattern 302b of the main pattern 302 are corresponding to the sub-patterns 325a and 325b of pattern 325 in the patterned underlayer structure 324 at the device region 302a respectively. Simultaneously, for the pattern 306 of the mark pattern 304 on the mask 300, the sub-pattern 306a and sub-pattern 306b of the pattern 306 are corresponding to the sub-patterns 327a and 327b of the mark 327 of the process monitor mark 326 in the patterned underlayer structure 324 at the unused region 302b. Furthermore, the frame pattern 308 of the mark pattern 304 is corresponding to a frame mark 328 of the process monitor mark 326.

It should be noticed that the mask critical dimension of the main pattern 302 is as same as that of the pattern 306. Preferably, the pattern 306 is a combination of the copies of the four corners of the main pattern 302. That is, the pattern 306 truly reflects the characteristics of the boundary of the main pattern 302. Therefore, it is understood that the line width P1 and the space width s1 of the pattern 325 in the device region 320a is as same as the line width P2 and the space width s2 of the mark 327 of the process monitor mark 326 respectively. On the other words, the critical dimension of the pattern 325 is as same as that of the mark 327.

Thereafter, between the sub-patterns in the device region 320a, a doped region 329 is formed in the substrate 320.

As shown in FIG. 3B, a material layer 330 is formed to cover the substrate 320. The material layer can be, for example, made of silicon oxide. It should be noticed that the width r of the frame mark 328 is about 2.2-3 times of the thickness of the material layer 330. Preferably, the width r of the frame mark 328 is about twice of the thickness of the material layer 330.

As shown in FIG. 3C, a photoresist layer 332 is formed over the patterned underlayer structure 324. The photoresist layer 332 is formed by using a mask 360 having a main pattern 362 and a pattern 364 in the main region 360a and the unused region 360b respectively for defining the pattern in the photoresist layer 332 in the device region 320a and the unused region 320b respectively. The unused region 360b of the mask 360 is corresponding to the unused region 320b of the substrate 320. It should be noticed that the size of the pattern 364 is larger than the pattern 306 but smaller than an area enclosed by the frame pattern 308. That is, the width x3 and the length y3 are larger than the width x1 and the length y1 (as shown in FIG. 3A) but smaller than the width x2 and the length y2 (as shown in FIG. 3A). Therefore, in the unused region 320b, the photoresist layer 332 covers the mark 327 of the process monitor mark 326 but leaves a portion of the material layer 330 over the frame mark 328 being exposed. Moreover, the location relationship between the pattern 364 and the main pattern 362 are identical to that between the mark pattern 304 and the main pattern 302.

Therefore, by measuring a distance d between the margin of the photoresist layer 332 in the unused region 320b of the substrate 320 and the frame mark 328 and determining the distance d is within the tolerance range, the quality of the photoresist patterning process can be obtained. That is, the measured distance d reflects the. patterning result of the photoresist layer 332 around the boundary between a peripheral region 320c and a device region 320a of the substrate 320.

In this preferred embodiment of the invention, only the right-hand side of the. process monitor mark 326 is shown in FIG. 3C. Practically, in the unused region 320b, the photoresist layer 332 covers the mark 327 and is enclosed by the frame mark 328. Hence, if the photoresist layer 332 in the unused region 320b is at the desirable region of the area enclosed by the frame mark 328, the distance d reflects the patterning result of the photoresist layer 332 around the boundary between the device region 320a and the peripheral region 320c with the use of the exposure factors. Besides, if the photoresist layer 332 in the unused region 320b is not at the desirable region of the area enclosed by the frame mark 328, the relatively shifting amount of the photoresist layer 332 in the unused region 320b reflects the relatively shifting amount of the photoresist layer 332 in the device region 320a around the boundary between the device region 320a and the peripheral region 320c.

Figure 4:
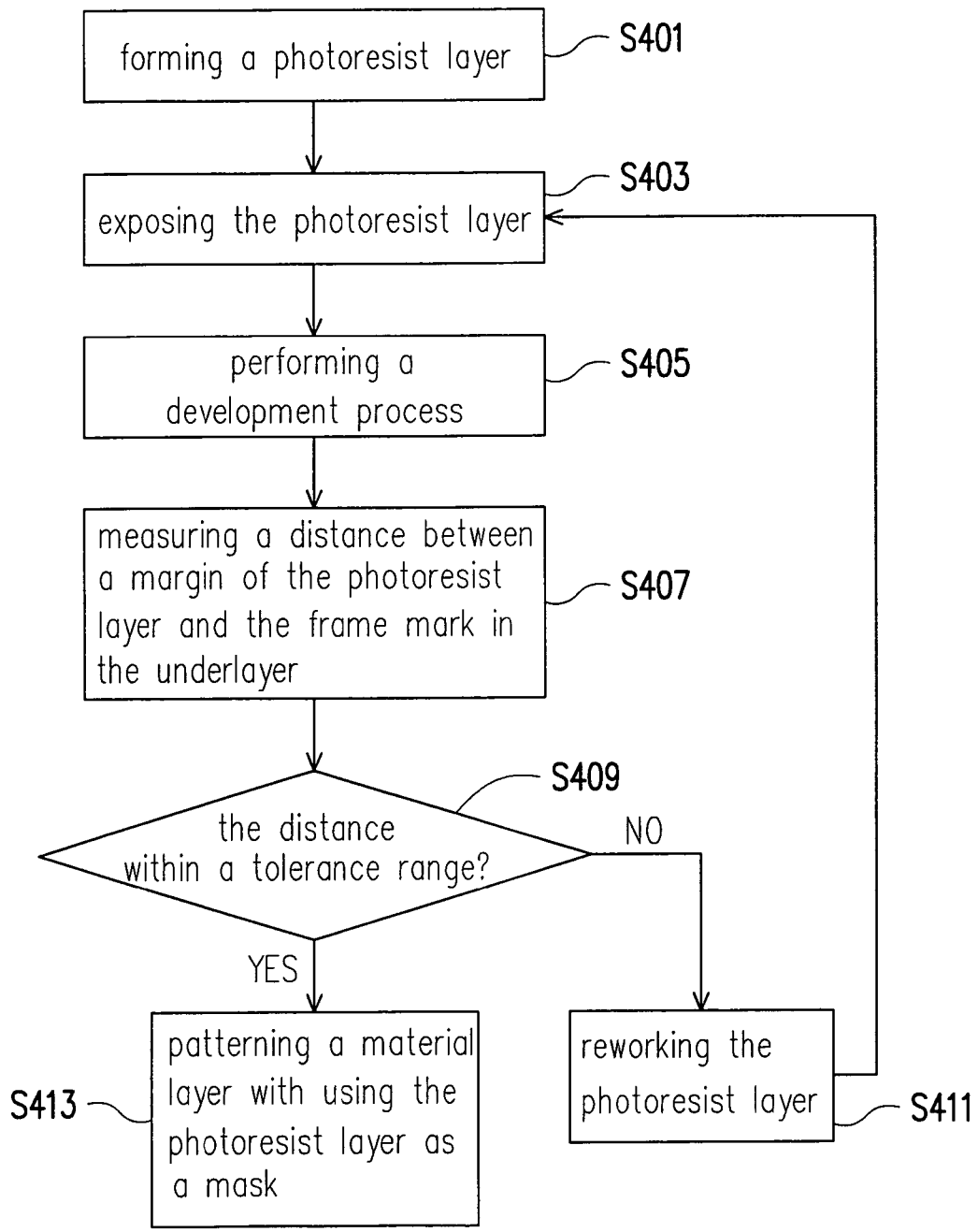
FIG. 4 is a flow char showing a method for patterning a material layer according to a preferred embodiment of the invention.

FIG. 4 is a flow char showing a method for patterning a material layer according to a preferred embodiment of the invention. As shown in FIG. 4 together with FIG. 3C, a photoresist layer is formed over the substrate (step S401). Then, the photoresist layer is patterned (the step S403 and the step S405). In the step S403, the photoresist layer is exposed with the use of the mask 360 (as shown in FIG. 3C). In the step S405, a development process is performed. Therefore, the main pattern 362 and the pattern 364 are transported into the photoresist layer to be a portion of the photoresist layer in the device region 320a and the other portion of the photoresist layer as a photoresist mark in the unused region 320b. In the unused region 320b, the photoresist mark covers the mark 327. Thereafter, in the step S407, a distance d between a margin of the patterned photoresist layer 332 and the frame mark. 328 in the underlayer is measured. In the step S409, the distance d is determined that whether the distance d is within a tolerance range. If the distance d is beyond the tolerance range, the photoresist is reworked by adjusting the exposing factors or refine the alignment (the step S411). The method for reworking the photoresist layer comprises steps of removing the patterned photoresist layer and then forming another photoresist layer over the substrate. Then, the steps S403, S405, S407 and S409 are repeated on the reworked photoresist layer until the measured distance d is within the tolerance range. If the distance d is within the tolerance range, the material layer 330 under the patterned photoresist layer 332 is patterned by using the patterned photoresist layer 332 as a mask (the step S413).

In the invention, by measuring the distance between the margin of the patterned photoresist layer and the frame mark, the patterning result of the photoresist layer in the device region can be obtained before the patterned photoresist is used as a mask for patterning the material layer. Therefore, the process can be well monitor by using the process monitor mark in the unused region. Furthermore, the margin of the patterned photoresist layer around the boundary of the device region and the peripheral region can be well controlled and predicted.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A process monitor mark for monitoring a patterning result of a photoresist layer over a patterned underlayer around the boundary between a peripheral region and a device region of a die, wherein the process monitor mark and a first pattern having a first critical dimension are simultaneously formed in the patterned underlayer at an unused region and the device region of the die respectively, the process monitor mark comprising:

a first mark with a second critical dimension, wherein the second critical dimension is as same as the first critical dimension; and a frame mark enclosing the first pattern, wherein for a material layer on the patterned underlayer and below the photoresist layer, a width of the frame mark is about 2.2-3 times of a thickness of the material layer.

2. The process monitor mark of claim 1, wherein the photoresist layer possesses a second pattern at the device region and a second mark at the unused region.

3. The process monitor mark of claim 2, wherein the second mark covers the first mark and is enclosed by the frame mark.

4. The process monitor mark of claim 2, wherein the second mark is larger than the first mark but is smaller than an area enclosed by the frame mark.

5. The process monitor mark of claim 1, wherein a line width of the first mark are as same as a line width of the first pattern.

6. The process monitor mark of claim 1, wherein a space width of the first mark are as same as a space width of the first pattern.

7. The process monitor mark of claim 1, wherein the unused region of the die includes a scribe line region.

8. A method for patterning a material layer over a wafer, wherein the material layer is formed on a patterned underlayer, the patterned underlayer possesses a first pattern and a process monitor mark at a device region and an unused region of the wafer respectively and the process monitor mark comprises a first mark and a frame mark enclosing the first mark, the method comprising:

let a width of the frame mark be about 2.2-3 times of a thickness of the material layer;

forming a first photoresist layer having a second pattern and a second mark on the material layer, wherein the second pattern is at the device region and the second mark covers the first mark located at the unused region;

measuring a distance between a margin of the second mark and the frame mark;

removing the first photoresist layer when the distance is not within a tolerance range; and patterning the material layer by using the first photoresist layer when the distance is within the tolerance range.

9. The method of claim 8, wherein the second mark is larger than the first mark but smaller than an area enclosed by the frame mark.

10. The method of claim 8, wherein a critical dimension of the first pattern is as same as that of the first mark.

11. The method of claim 8, wherein a line width of the first mark are as same as a line width of the first pattern.

12. The method of claim 8, wherein a space width of the first mark are as same as a space width of the first pattern.

13. The method of claim 8, wherein the unused region includes a scribe line region.

* * * * *

UNITED STATES PATENT AND TRADEMARK OFFICE
CERTIFICATE OF CORRECTION

PATENT NO. : 7,652,284 B2  Page 1 of 1
APPLICATION NO. : 11/340910
DATED : January 26, 2010
INVENTOR(S) : Chin-Cheng Yang It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 840 days.

Signed and Sealed this

Twenty-third Day of November, 2010

David J. Kappos
*Director of the United States Patent and Trademark Office*